United States Patent
Even et al.

(10) Patent No.: US 6,762,913 B1
(45) Date of Patent: Jul. 13, 2004

(54) METHOD FOR CONTROLLING COMMON MODE IMPEDANCE IN DISK DRIVE HEAD SUSPENSIONS

(75) Inventors: Marc A. Even, Minnetonka, MN (US); Larry C. Webb, Jr., Hutchinson, MN (US)

(73) Assignee: Hutchinson Technology Inc., Hutchinson, MN (US)

( * ) Notice: Subject to any disclaimer, the term of this patent is extended or adjusted under 35 U.S.C. 154(b) by 0 days.

(21) Appl. No.: 10/386,625

(22) Filed: Mar. 12, 2003

Related U.S. Application Data

(62) Division of application No. 09/835,891, filed on Apr. 16, 2001.

(51) Int. Cl.$^7$ .............................. G11B 5/55; G11B 21/08
(52) U.S. Cl. .................. 360/246; 360/245.9; 360/244.9
(58) Field of Search ...................... 174/113 R; 324/600, 324/602, 601; 360/244.2, 244.3, 244.9, 245.8, 245.9, 246

(56) References Cited

U.S. PATENT DOCUMENTS

| | | | | |
|---|---|---|---|---|
| 5,594,607 A | * | 1/1997 | Erpelding et al. | ....... 360/244.3 |
| 5,606,477 A | * | 2/1997 | Erpelding et al. | ....... 360/244.3 |
| 5,608,591 A | * | 3/1997 | Klaassen | ................. 360/245.9 |
| 5,717,547 A | * | 2/1998 | Young | ........................ 360/246 |
| 5,796,552 A | * | 8/1998 | Akin et al. | ............... 360/264.2 |
| 5,995,328 A | * | 11/1999 | Balakrishnan | ........... 360/245.9 |
| 5,995,329 A | * | 11/1999 | Shiraishi et al. | ......... 360/245.9 |
| 6,038,102 A | * | 3/2000 | Balakrishnan et al. | ... 360/264.2 |
| 6,275,358 B1 | * | 8/2001 | Balakrishnan et al. | ... 360/264.2 |
| 6,351,351 B1 | * | 2/2002 | Takasugi | ................. 360/245.9 |
| 6,493,190 B1 | * | 12/2002 | Coon | ....................... 360/245.9 |
| 2002/0181156 A1 | * | 12/2002 | Shiraishi et al. | ......... 360/245.9 |

FOREIGN PATENT DOCUMENTS

| | | | | |
|---|---|---|---|---|
| WO | WO 9736290 A1 | * | 10/1997 | ............ G11B/5/55 |
| WO | WO 9814937 A1 | * | 4/1998 | ............ G11B/5/55 |

OTHER PUBLICATIONS

Accurate Quasi–Tem Analysis of Modified Coupled Suspended Microstriplines and its Application to Directional Coupler Design; Masot, F., Medina, F., and Horno, M.; Microwave and Optical Technology Letters; vol. 4, No. 2, Jan. 20, 1991; pp. 66–72.

* cited by examiner

*Primary Examiner*—William Klimowicz
(74) *Attorney, Agent, or Firm*—Faegre & Benson LLP

(57) ABSTRACT

A method of adjusting the common mode impedance while enabling maintenance of the differential mode impedance of a pair of traces located with respect to a ground plane formed by a load beam or trace assembly of a disk drive head suspension. The method includes forming a ground plane having apertures with isolated conductive islands in the apertures for setting a desired common mode impedance. The method includes a cut and try approach using sample coupons to adjust the ratio of backed area to island area to adjust the common mode impedance while maintaining the differential mode impedance by maintaining the ratio of unbacked area to the sum of the backed and island areas.

10 Claims, 17 Drawing Sheets

METHOD FOR CONTROLLING COMMON MODE IMPEDANCE IN DISK DRIVE HEAD SUSPENSIONS

CROSS REFERENCE TO RELATED APPLICATION

This is a Division of U.S. patent application Ser. No. 09/835,891, titled APPARATUS AND METHOD FOR CONTROLLING COMMON MODE IMPEDANCE IN DISK DRIVE HEAD SUSPENSIONS, filed Apr. 16, 2001, for which priority is claimed. The entire contents of patent application Ser. No. 09/835,891 is hereby incorporated in its entirety by reference.

BACKGROUND OF THE INVENTION

In the past, it has been known to use printed circuit electrical traces on a head suspension for disk drives. The head suspension itself is typically formed of steel, and serves as a supporting structure for the traces, separated therefrom by a thin insulator layer. The metallic nature of the supporting structure or layer affects both the differential mode impedance and the common mode impedance with respect to the electrical traces which are used to carry signals between a read/write head carried on the suspension and related circuitry off the suspension.

To address these issues, it has been known to remove one or more portions of the metallic layer to alter the impedances affecting the traces. Such removed portions have been informally known as "windows."

The present invention relates to an apparatus and method for controlling the common mode impedance, typically increasing the value thereof, while allowing independent control of the differential mode impedance. This is accomplished by providing at least some windows with electrically isolated islands or "doors" therein to enable an increase in the common mode impedance while maintaining a desired level of differential mode impedance.

DETAILED DESCRIPTION OF THE INVENTION

Figure 1:
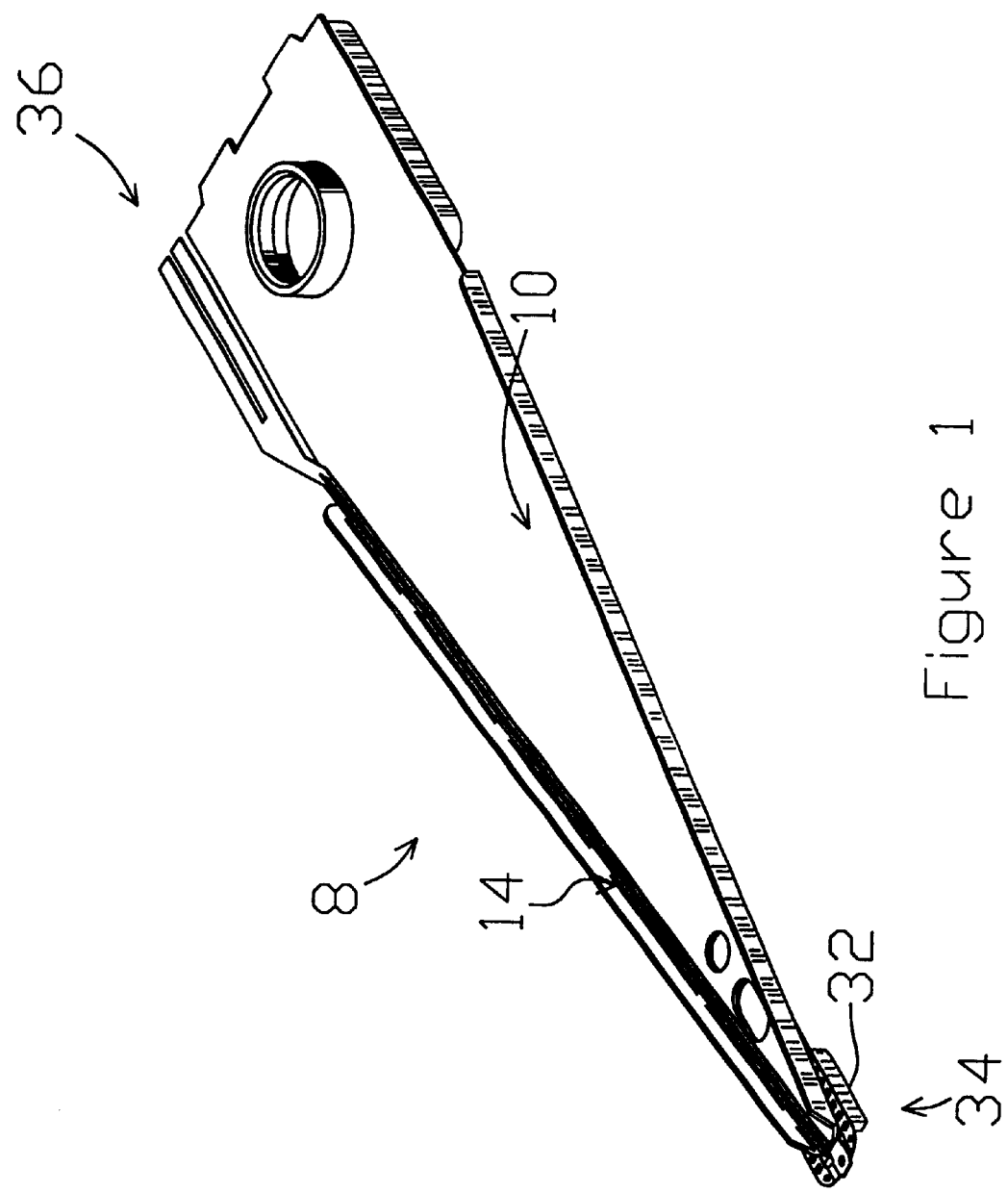
FIG. 1 is an isometric view of a head suspension assembly according to the present invention, illustrating a conductive trace mounted to the load beam.
Figure 2:
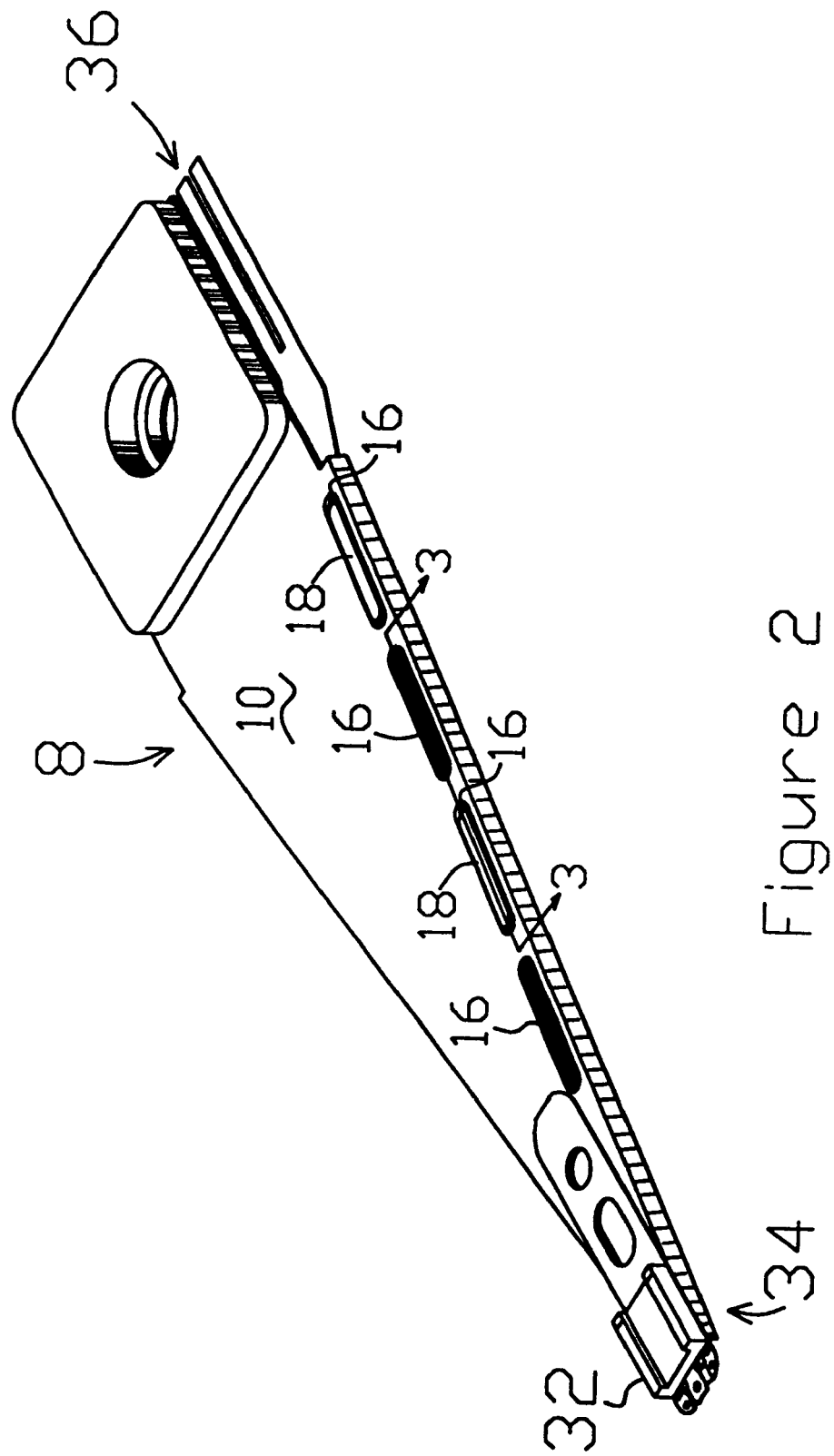
FIG. 2 is an isometric view of the reverse side of the head suspension assembly of FIG. 1, showing discontinuities in the load beam surface spaced beneath the conductive trace.

Referring now to the Figures, and most particularly to FIGS. 1 and 2, a head suspension assembly 8 useful in the practice of the present invention may be seen. An electrical insulation layer 12 is used between each of a pair (or more) of conductors or printed circuit traces 14 and the load beam 10. Load beam 10 is preferably made from sheet stainless steel. The electrical insulation layer 12 is preferably a polyimide material. Traces 14 may be copper or a beryllium copper alloy such as BeCu 172 or other similar suitable materials.

The conductive layer 10 may be etched or otherwise processed to create apertures 16 under the traces 14 to reduce capacitive coupling which is generally detrimental to signal transmission at high frequencies.

One or more apertures 16 may have one or more islands 18 located therein. It is to be understood that island 18 is electrically isolated from the conductive layer 10 by a gap 20. Furthermore, island 18 is electrically isolated from the traces 14 by insulation layer 12, even though island 18 is positioned under traces 14. It has been found that providing islands in at least some of the apertures enables control of both the differential mode impedance of the traces 14 and the common mode impedance of the combination of the traces 14 and the ground plane formed by the load beam 10. Generally, it is desirable to have a predetermined differential mode to match impedance with, for example, a read/write transducer head 32 at a distal end 34 of the assembly 8 and driver circuitry (not shown) connected to the traces 14 at a proximal end 36 of the assembly 8. At the same time, it has been found desirable to have a relatively high common mode impedance between traces 14 and the conductive layer 10 for noise suppression.

Figure 3:
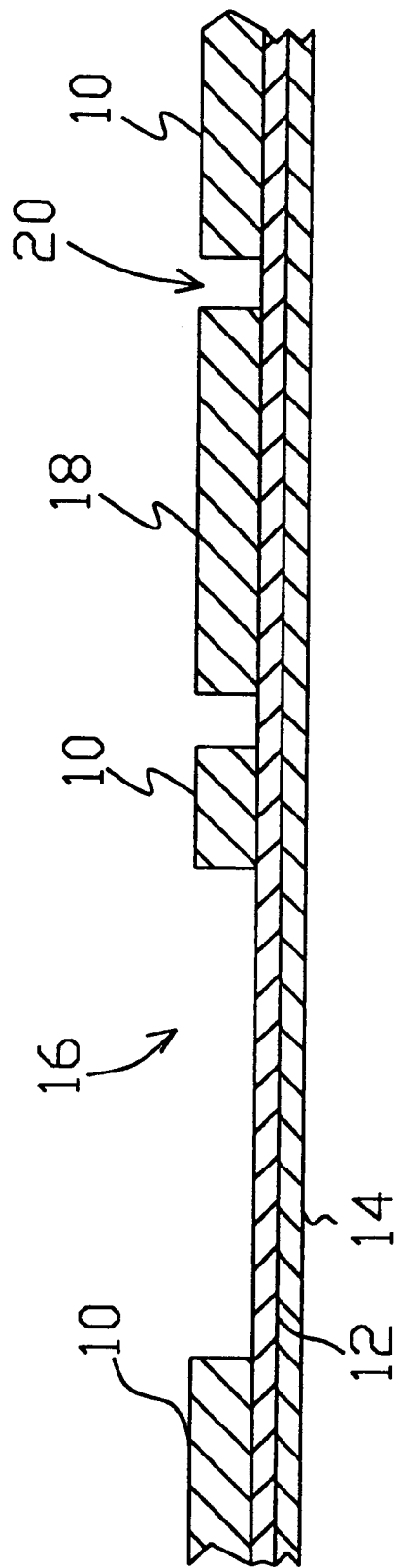
FIG. 3 is a cross section view taken along line 3—3 of FIG. 2.
Figure 4:
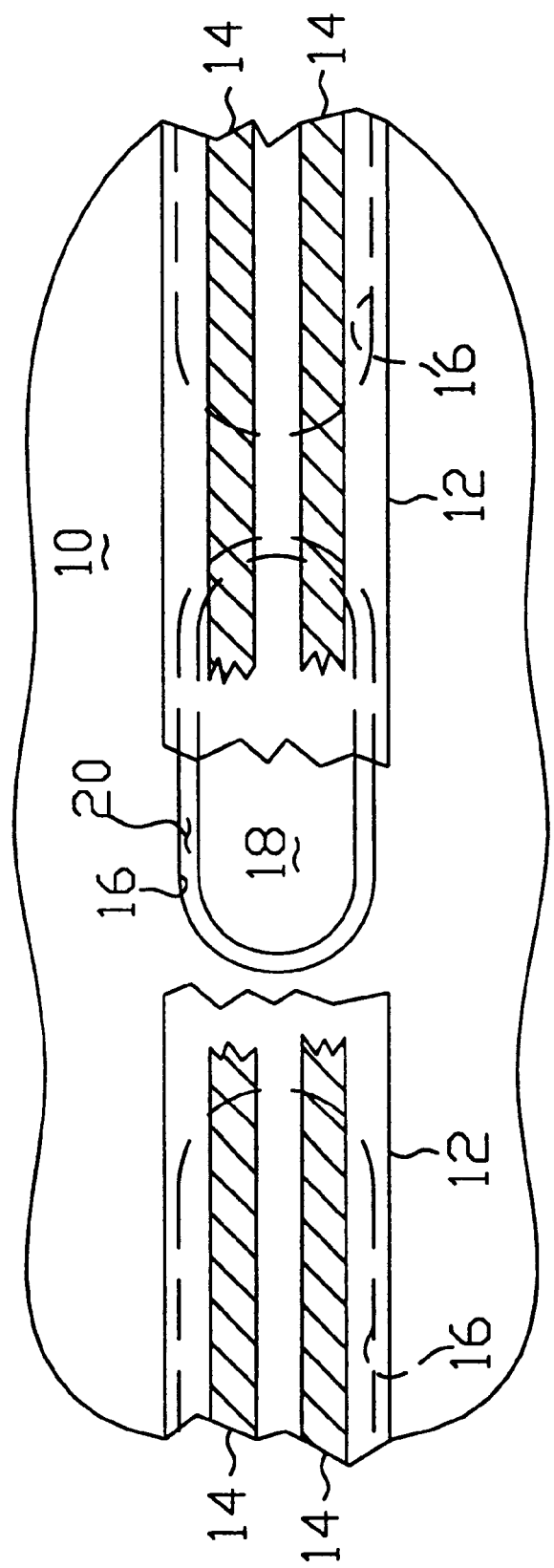
FIG. 4 is an enlarged plan view of a detail portion of FIG. 1, partially cut away to illustrate certain aspects of the present invention.

Referring now also FIGS. 3 and 4, an island 18 may be formed in one or more apertures 16, by etching the conductive layer 10 after application of the insulating layer 12. It may be found desirable to have some apertures without islands and some apertures formed with islands, as will be described in more detail infra. As can be seen most clearly in FIGS. 3 and 4, the islands are held in position by the insulating layer 12 which also supports conductive traces 14. The traces 14 are juxtaposed over the insulating layer 12 which is located over the load beam and apertures 16 and one or more islands 18.

Figure 5:
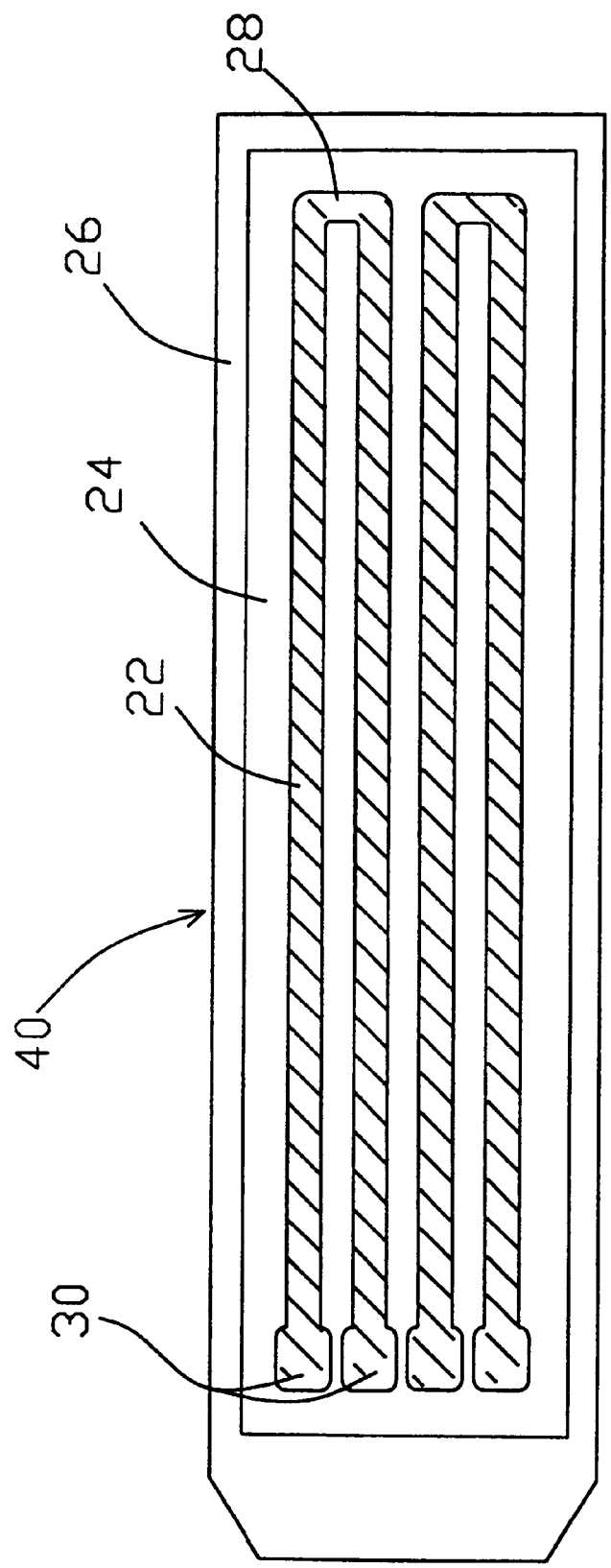
FIG. 5 is a sample coupon useful in the practice of the present invention.
Figure 6:
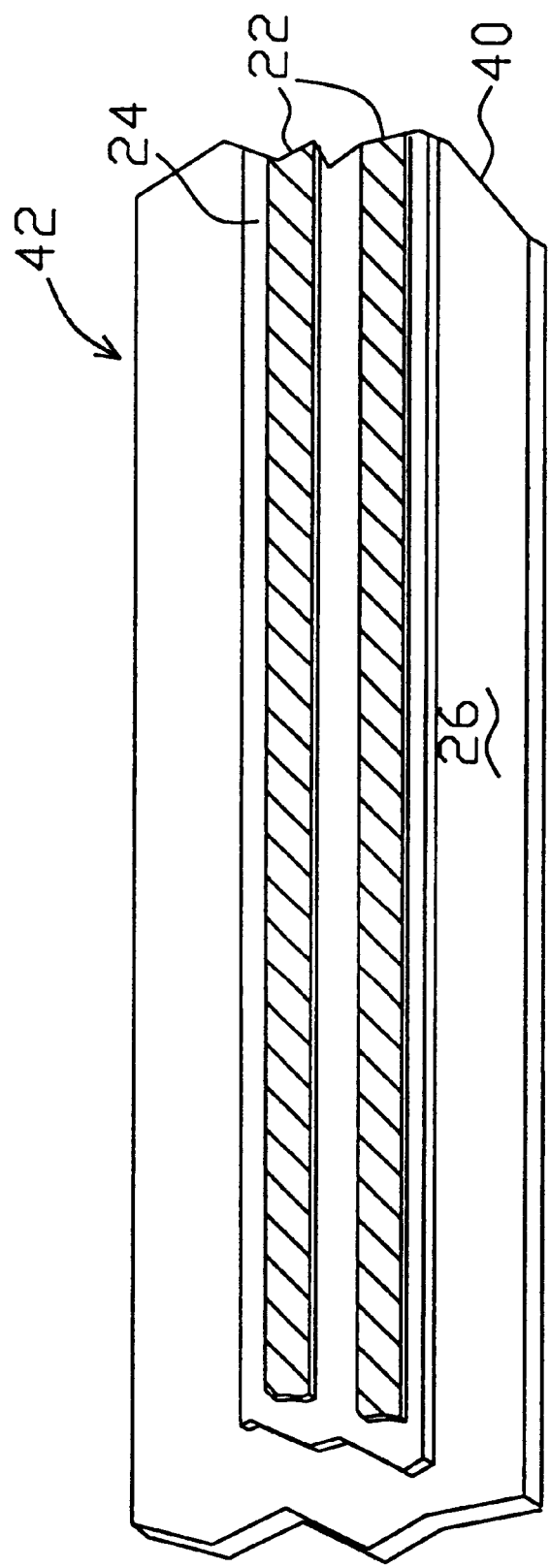
FIG. 6 is an enlarged plan view of a portion of a fully backed coupon similar to that of FIG. 5.
Figure 7:
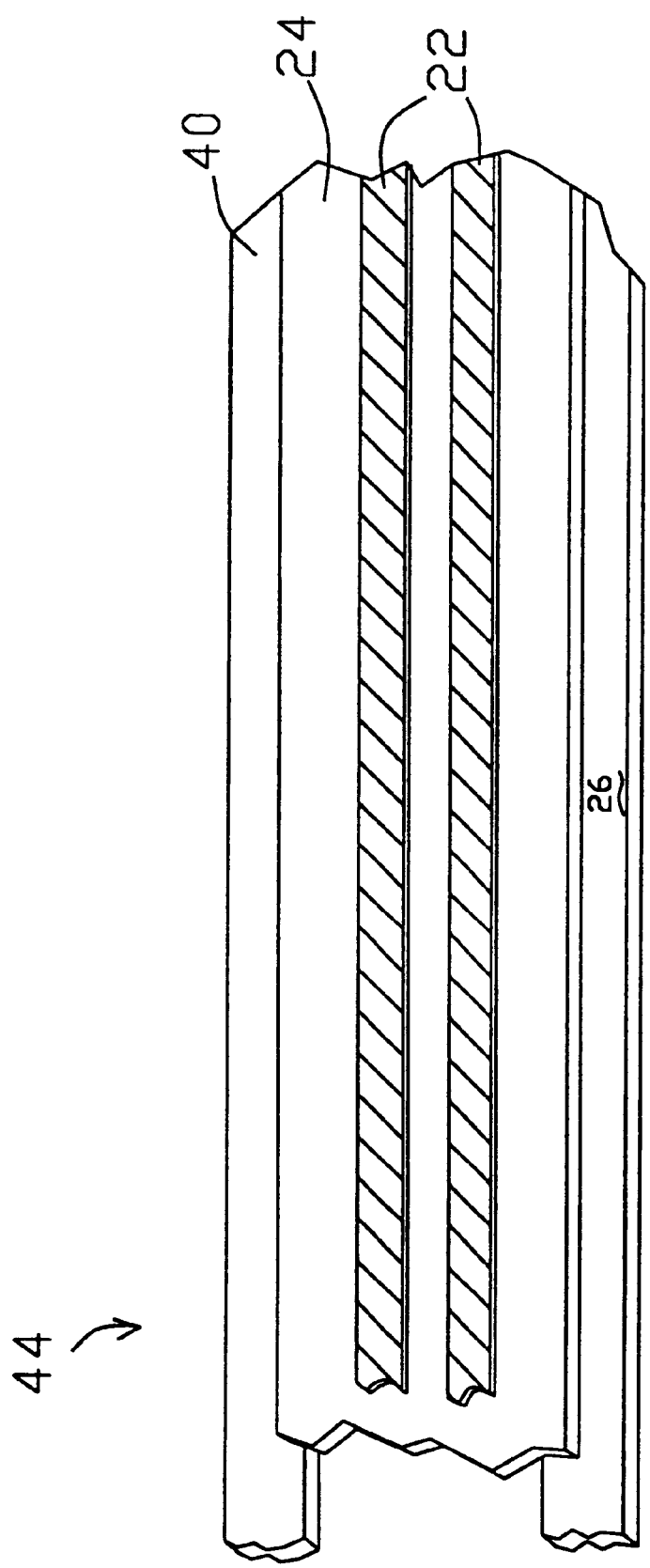
FIG. 7 is an enlarged plan view of a portion of a completely unbacked coupon similar to that of FIG. 5.
Figure 8:
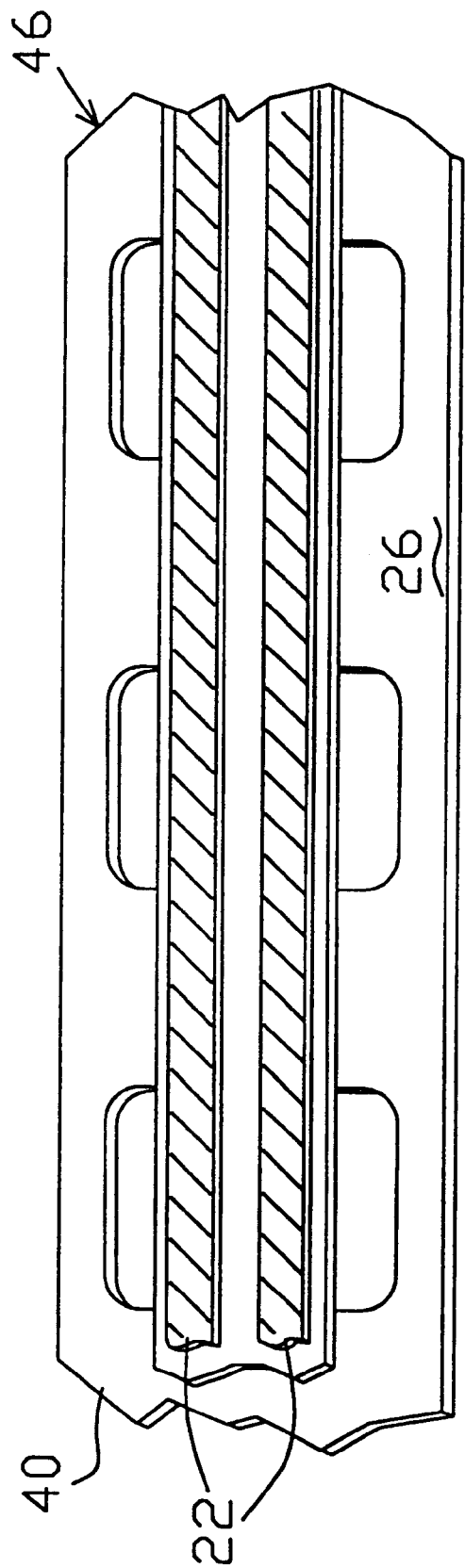
FIG. 8 is an enlarged plan view of a portion of a coupon similar to that of FIG. 5, except with windows present in the metallic layer of the coupon.

Referring now also to FIGS. 5–9, it has been found desirable to use a number of test coupons, an example of which is shown as coupon 40 in FIG. 5, to characterize both the differential mode and common mode impedances of structures to be formed into assembly 8. It is to be understood that each coupon has at least a pair of traces 22 mounted on an insulating layer 24 attached to a stainless steel back plane 26. The pair of traces is 50 mm long, with a short 28 between the pair of traces at a distal end, and has a pair of terminals 30 at a proximal end. The width of individual traces and spacing between the pair of traces is normally held constant for a given pair of traces, but it is to be understood that width and spacing values may be chosen as desired. For the coupons shown herein the trace width is 50 microns and the spacing is 40 microns. A fully backed structure 42 as shown in FIG. 6 will characteristically have low differential and common mode impedances, typically in the range of 50 to 60 ohms. A completely unbacked structure 44 as shown in FIG. 7 will characteristically have high differential and common mode impedances, typically in the range of 90 to over 100 ohms. A structure 46 with windows 50, as shown in FIG. 8 will characteristically have intermediate differential and common mode impedances. It is to be understood that a "windowed section" is a section containing a backed and an unbacked portion. The "percent windowing" is the length ratio along the direction of the traces 14 of the unbacked portion to the length of the windowed section.

Figure 9:
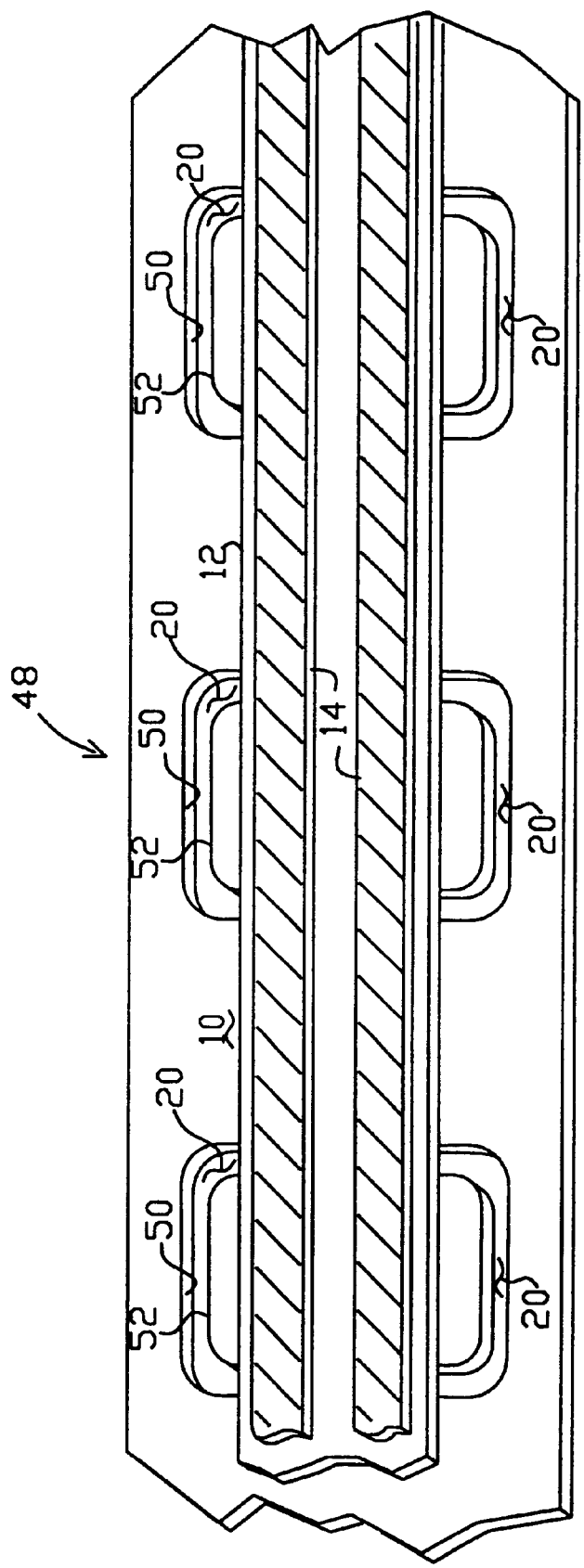
FIG. 9 is an enlarged plan view of a portion of a coupon similar to that of FIG. 5, except with doors present in the windows of the metallic layer of the coupon.

Referring now also to FIG. 9, a structure 48 having both windows 50 and islands 52 permits control of both differential and common mode impedances. Although islands 52 are shown in every window 50 of structure 48, it is to be understood that the present invention contemplates alternating sections of higher and lower characteristic impedance (by alternating backed and unbacked sections) a line approximating an intermediate characteristic impedance can be obtained, provided that the length of the section is much less than the highest wavelength of interest. Keeping the section length to less than 1 mm will allow operation up to about 20 GHz, by following the rule of thumb of keeping the section length less than or equal to λ/10. It also has been found desirable to keep the impedance changes from section to section relatively low; stated another way, the larger the impedance change from section to section, the smaller the section length should be.

Figure 10:
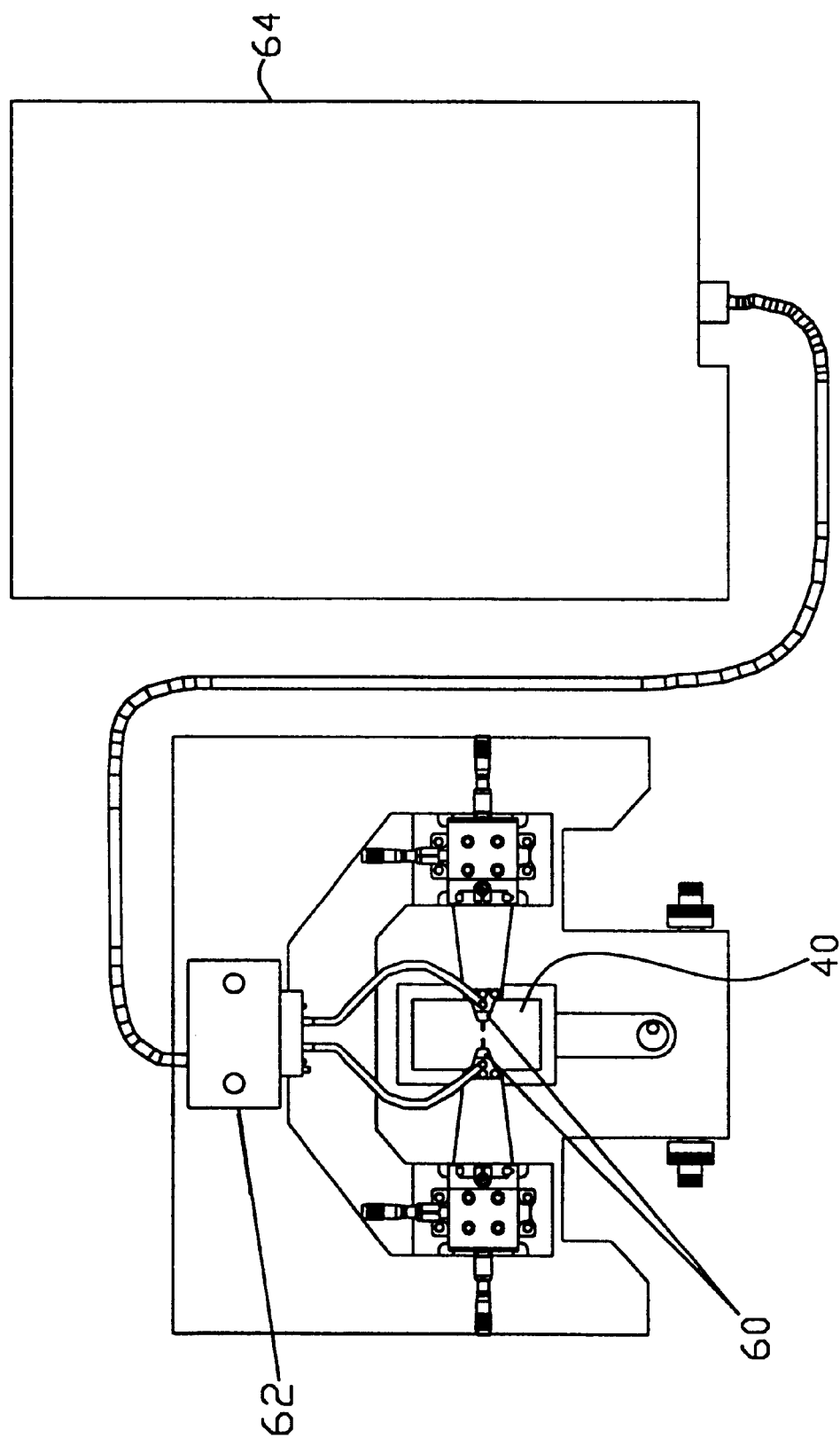
FIG. 10 is a top plan view of a test setup to measure differential and common mode impedance using a test coupon.
Figure 11:
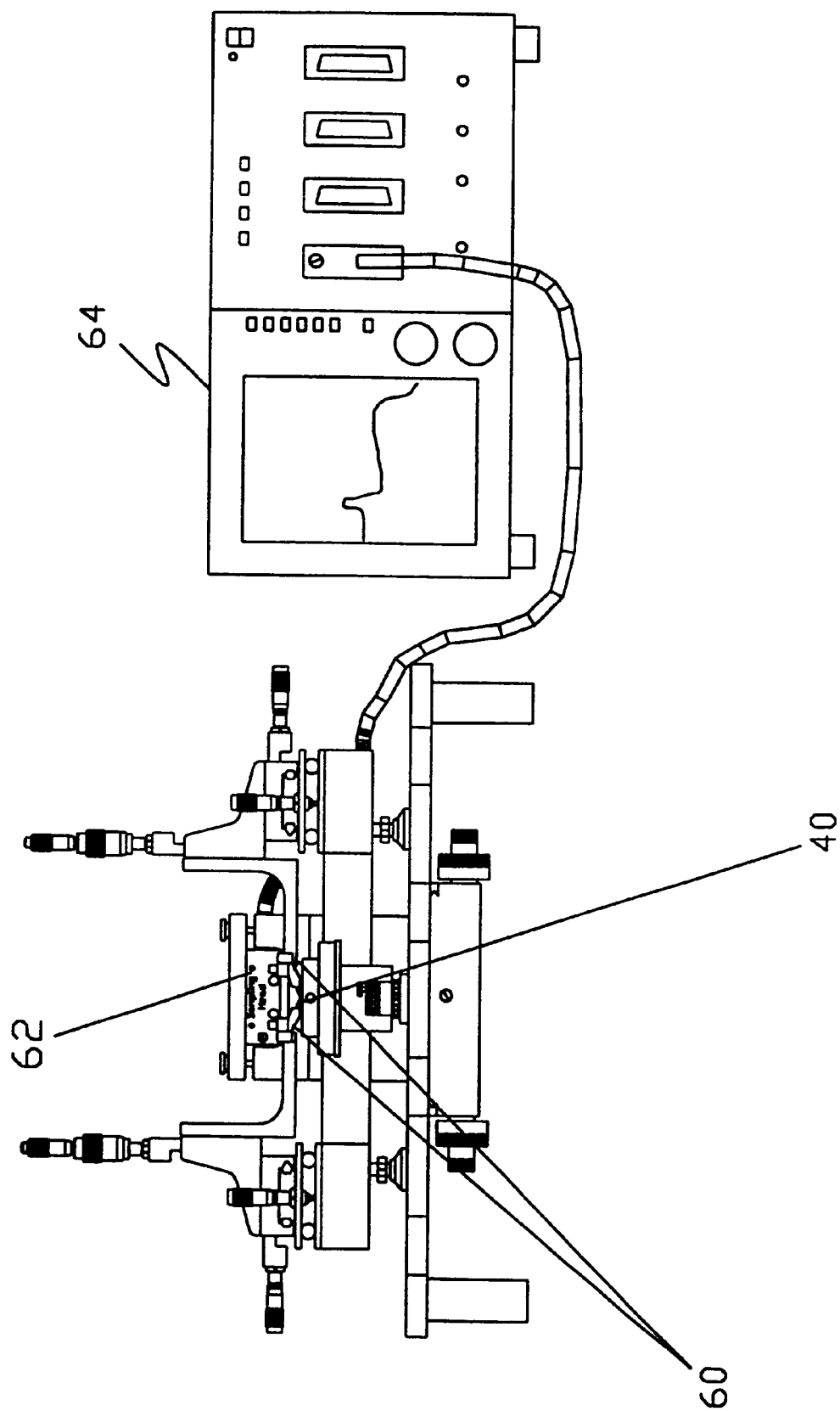
FIG. 11 is a side elevation view of the test setup of FIG. 10.

The characteristic impedance is determined using time domain reflectometry on a coupon having the structure of interest thereon. A test setup for taking TDR measurements is shown in FIGS. 10 and 11. A pair of probes 60 are connected to a TDR Generator sampling head 62, available from Tektronix in Beaverton, Oreg., which in turn is connected to a digital sampling oscilloscope 64 such as a model 11081C, also available from Tektronix.

Figure 12:
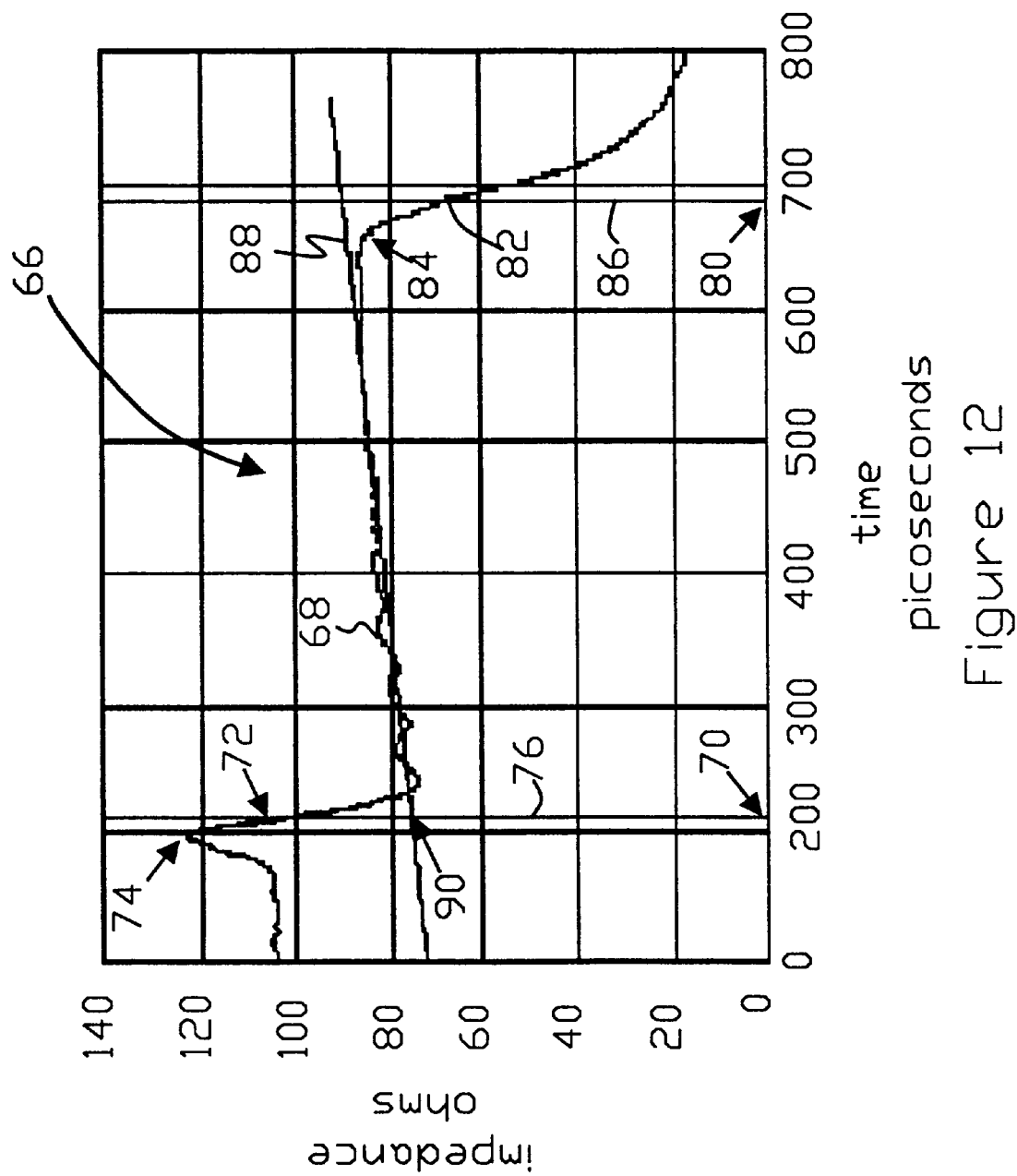
FIG. 12 is a waveform showing a differential mode impedance measurement for a fully backed coupon.

An example measurement 66 taken by the test setup of FIGS. 10 and 11 is shown as waveform 68 in FIG. 12. FIG. 12 shows impedance in ohms on the ordinate plotted against time in picoseconds on the abscissa. In this test, a pair of traces 50 microns wide and 50 mm long, separated by a 40 micron gap was excited with a step input waveform with a 35 ps (picosecond) risetime. The thicknesses of the various layers were as follows: stainless steel layer: 20 microns, insulating layer: 18 microns, and copper trace layer: 18 microns.

By convention, the initial starting point is the time 70 of inflection point 72 after the first peak 74 of the waveform, indicated by line 76. Similarly, the ending point is the time 80 of the inflection point 82 after the waveform drops off at 84, indicated by line 86. A best fit linear sloped line 88 is matched to the overall slope of the waveform between the starting and ending times, and the intersection 90 of the start line and the sloped line gives the characteristic impedance, in this instance, 77 ohms.

Figure 13:
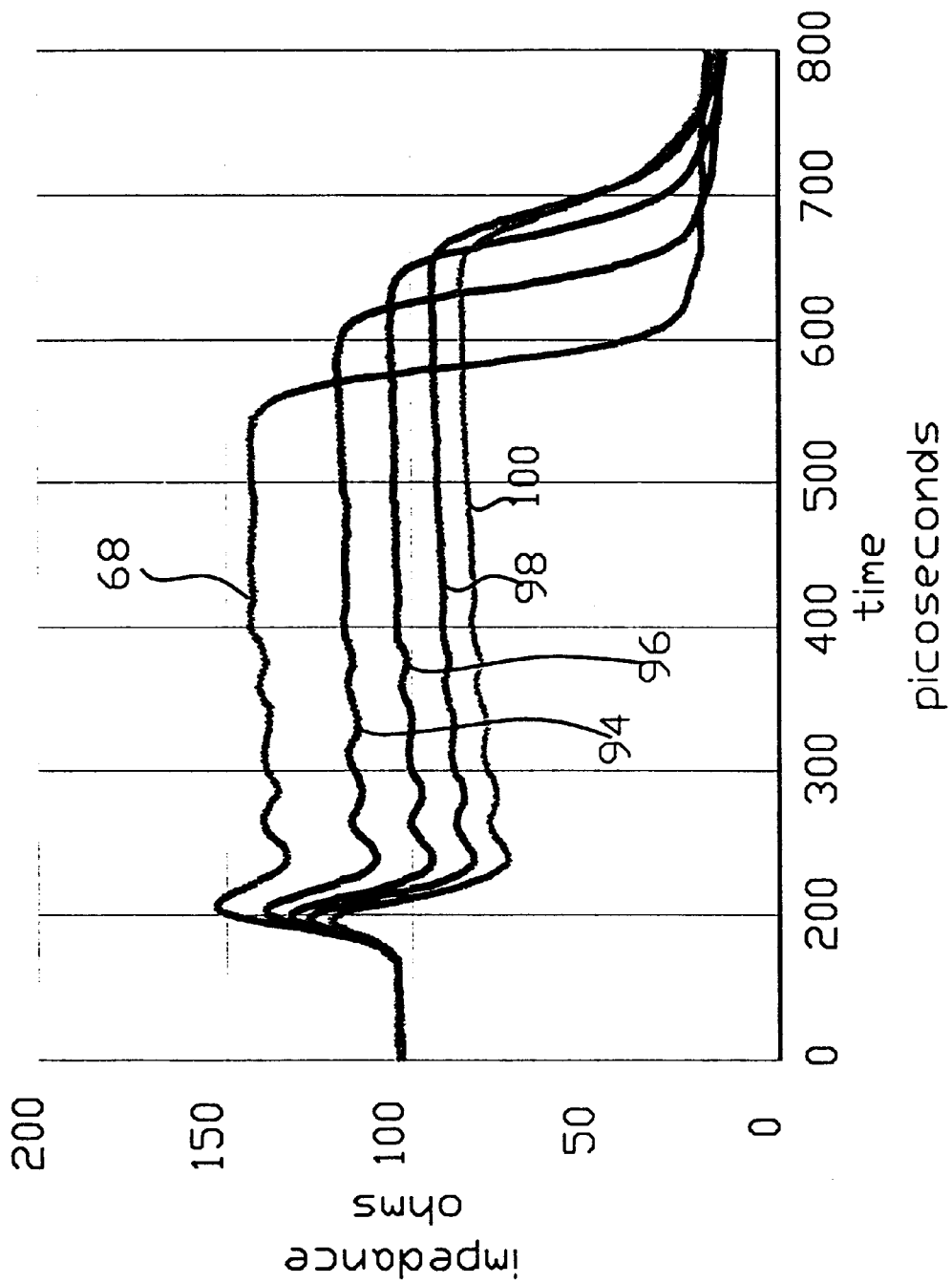
FIG. 13 is a set of waveforms showing differential mode impedance measurements for four windowed coupons.

Referring now also to FIG. 13, five waveforms 68, 94, 96, 98, and 100 are shown for 0, 25, 50, 75 and 100 percent windowing with the length of one section being 1 mm in the longitudinal direction of the traces, it being understood that the trace related dimensions are the same as those for FIG. 12, and that 0% windowing is for a fully backed conductive layer beneath the traces, and 100% windowing is for a fully unbacked conductive layer. As explained in more detail infra, a section is made up of a fully backed subsection, a fully unbacked subsection, and a partially backed subsection having a door or island therein. Waveform 68 in FIG. 13 is the same waveform from FIG. 12, except on a different scale.

Table 1 gives the parameters corresponding to the waveforms in FIG. 13.

TABLE 1

| WAVE-FORM | PERCENT WINDOWING | Zo Measured Ohms | Zo Calculated Ohms | Time Delay Measured | Time Delay Calculated |
|---|---|---|---|---|---|
| 68 | 100 | 137 | 137 | 180 | 180 |
| 94 | 75 | 114 | 115 | 208 | 200 |
| 96 | 50 | 97 | 99 | 226 | 216 |
| 98 | 25 | 86 | 87 | 237 | 227 |
| 100 | 0 | 77 | 77 | 237 | 237 |

Impedance Design Technique

In order to size islands to be placed in windows of a head suspension assembly, it has been found desirable to obtain data using test coupons. The process generally is as follows. First, measure multiple coupons with different arrangements of the conductive layer (i.e., fully backed, fully unbacked, and coupons with "full" windows (i.e., with islands substantially filling the windows, but electrically isolated from the window "frames") to establish baseline data. The parameters of differential and common mode impedances, and differential and common mode time delays are derived from the measurements (as described with respect to FIG. 12, above). The parameters are then inserted in a mathematical model, using equation (1):

$$Z_{in} = Z_o[(Z_R \cos \beta l + j Z_o \sin \beta l)/(Z_o \cos \beta l + j Z_R \sin \beta l)] \quad (1)$$

where $$\beta = 2\pi/\lambda \quad (2)$$

and $Z_R$ is the impedance of the prior section, and $Z_o$ is characteristic impedance, λ is the wavelength in the medium of interest, and l is the length (in meters) of the section under consideration. It has then been found desirable to iterate the above steps, varying the amount of backed area present including the islands and any other conductive layer area under the traces until a desired characteristic common mode impedance is obtained.

In order to hold differential mode impedance constant, the percentage of unbacked to total backed area of the conductive layer under the traces is held constant. The total backed area is made up of electrically isolated islands and electrically connected portions of the conductive layer. To vary the common mode impedance, the ratio of the island areas to the electrically connected portions is varied.

More particularly, the steps in designing a structure according to the present invention are as follows:

1. Measure a 100% backed coupon using time domain reflectometry (TDR) as described above. Then extract the backed unit parameters (BUP) from the measured data.
2. Measure a 100% unbacked (fully unbacked) coupon using TDR. Then extract unbacked unit parameters (UUP) from the measured data.
3. Measure a 100% door coupon (i.e., a fully windowed coupon having islands in each window) using TDR. Then extract door unit parameters from the measured data. All unit parameters (BUP, UUP, and DUP) will be in the form:
    *UP
      differential impedance (Zo (diff)) as measured at very high frequency in ohms. Normalized to 1 meter.
      differential time delay (TD (diff)) as measured at very high frequency in ohms. Normalized to 1 meter.
      common mode impedance (Zo (cm)) as measured at very high frequency in ohms. Normalized to 1 meter.
      common mode time delay (TD (cm)) as measured at very high frequency in ohms. Normalized to 1 meter.
4. Determine the maximum frequency of the wave that will travel through the interconnect, f(max).
5. Determine the wavelength of f(max) using the highest permittivity of the materials being used, 1(max).
6. The maximum section length should be <(1/10)*1(max).
7. A section will be made of a combination (subsections) of backed transmission line, unbacked transmission line, and door transmission line. Each individual subsection's length, or the sum of the lengths of like subsections, divided by the section length will be the percent length for that subsection. The sum of the percent length of these structures will equal 100% for each section. The percent length of any subsection can range from 0–100%.
All subsection percent lengths shall be labeled as
    %*
      *=B for a fully backed transmission line subsection
      *=W (window) for a fully unbacked transmission line subsection
      *=D (door) for a transmission line subsection having an isolated island in a window
All subsection lengths shall be labeled as
    L*
      *=B for a fully backed transmission line subsection
      *=W for a fully unbacked transmission line subsection
      *=D (door) for a transmission line subsection having an isolated island in a window
8. Arbitrary % B, % W, and % D are picked.
9. Differential impedance and time delay will be determined using standard transmission line theory on a circuit with discrete subsections connected together to form (n) series sections, where n is equal to designated interconnect length divided by the section length.
For the fully backed subsection:
    Zo=BUP(Zo(diff)); and time delay=BUP((TD (diff))*LB
For the fully unbacked subsection:
    Zo=UUP(Zo(diff)); and time delay=UUP((TD(diff))*LW
For the door subsection:
    Zo=DUP(Zo(diff)); and time delay=DUP((TD (diff))*LD
10. In the case where the differential impedance is lower than the design target, the % W should be increased and the % B and % D both decreased.
11. In the case where the differential impedance is higher than the design target, the % W should be decreased and the % B and % D both increased.
12. Steps 9–11 may be repeated until convergence to the design target is achieved.
13. Common mode impedance and time delay will be determined using standard transmission line theory on a circuit with discrete subsections connected together to form (n) series sections, where n is equal to designated interconnect length divided by the section length.
For the fully backed subsection:
    Zo=BUP(Zo(comm)); and time delay=BUP((TD(comm))*LB
For the fully unbacked subsection:
    Zo=UUP(Zo(comm)); and time delay=UUP((TD(comm))*LW
For the door subsection:
    Zo=DUP(Zo(comm)); and time delay=DUP((TD(comm))*LD
14. In the case where the common mode impedance is higher than the design target the % B should be increased and the % D decreased.
15. In the case where the common mode impedance is lower than the design target the % B should be decreased and the % D increased.
16. Steps 13–15 will be repeated until convergence to the design target.
17. Slight changes in differential impedance and time delay may occur when converging to a common mode impedance target. For better refinement, steps 9–13 and 14–15, may be repeated.

Figure 14:
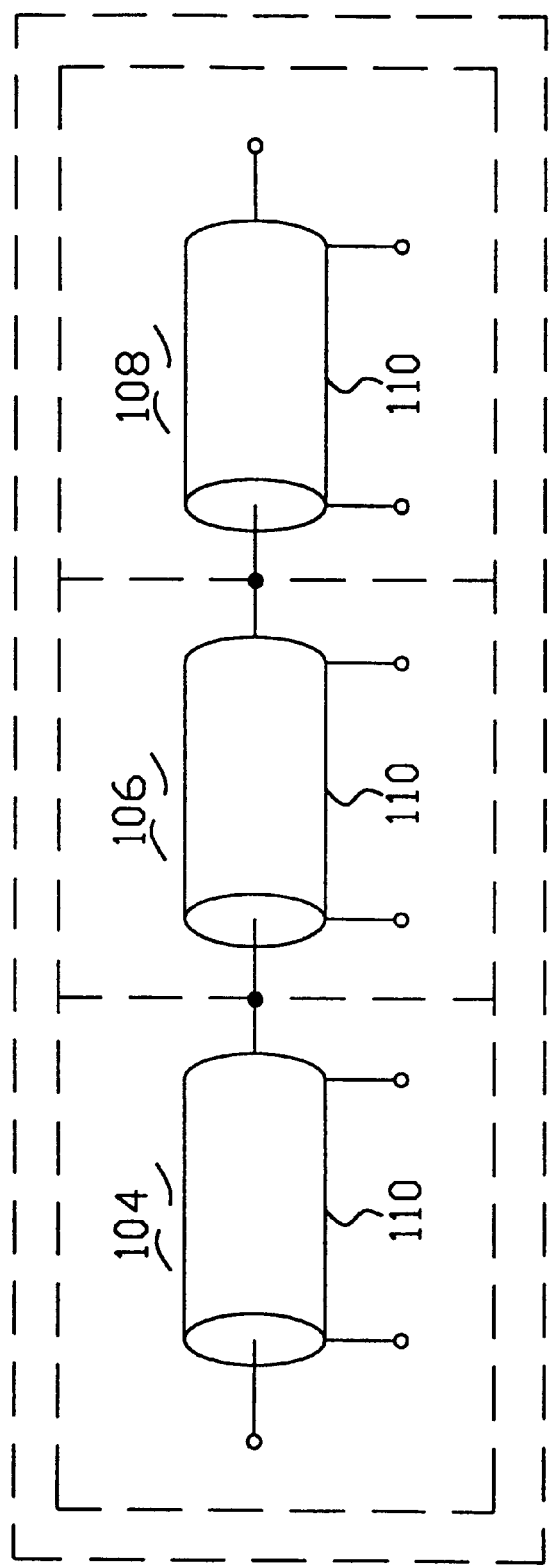
FIG. 14 is a simplified model of a section of transmission line useful in illustrating aspects of the present invention.

Referring now most particularly to FIG. 14, a visual representation in the form of a section 102 of transmission line is shown. Section 102 has a first subsection 104, a second subsection 106 and a third subsection 108. It is to be understood that the transmission line segments 110 correspond to the transmission line parameters, Zo and TD, with segment 110 in subsection 104 corresponding to a fully backed subsection (B), and with segment 110 in subsection 106 corresponding to a fully unbacked subsection (U), and with segment 110 in subsection 108 corresponding to a door subsection (D). The characterizing parameters for each subsection are in the following format.
For subsection 104:
    Zo=BUP(Zo(xxxx)); and time delay=BUP((TD(xxxx))*LB
For subsection 106:
    Zo=UUP(Zo(xxxx)); and time delay=WUP((TD(xxxx))*LW
For subsection 108:
    Zo=DUP(Zo(xxxx)); and time delay=DUP((TD(xxxx))*LD
    where "xxxx"=either "diff" or "comm," as the case may be.
Utilizing conventional transmission line theory, this notation refers to a repeating structure or section 102 of a series of 3 transmission line subsections 104, 106, and 108 with each subsection having respective parameters Zo and time delay TD, for differential or common mode characteristics.

Figure 15:
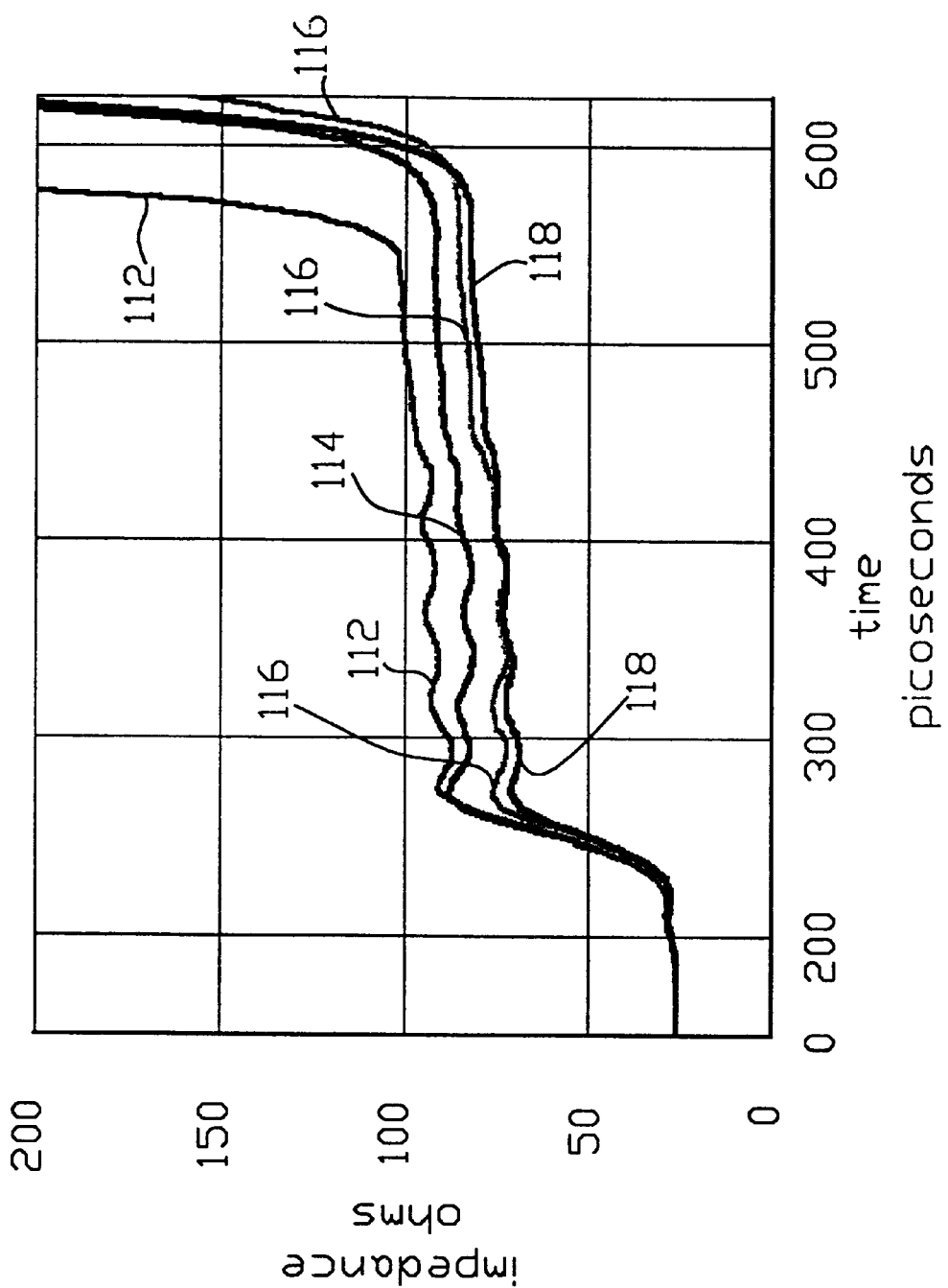
FIG. 15 is a set of waveforms showing common mode impedance measurements for four coupons having varying percents of windows and doors in the coupons.

Referring now most particularly to FIG. 15, four waveforms for determining common mode impedance for various percentages of window and door combinations may be seen. The common mode impedance in ohms is plotted along the ordinate and time in picoseconds is plotted along the abscissa. Waveform 112 is for a coupon having a 90.6% window and a 9.4% door. Waveform 114 is for a coupon having a 58% window and a 42% door. Waveform 116 is for a coupon having a 31% window and a 69% door. Waveform 118 is for a coupon having a 10% window and a 90% door.

The data for FIG. 15 is shown in Table 2 below:

TABLE 2

| Waveform | Percent Backed | Percent Window | Percent Door | $Z_0$ (comm) Measured Ohms | $Z_0$ (comm) Calculated Ohms | Time Delay Measured ps | Time Delay Calculated ps |
| --- | --- | --- | --- | --- | --- | --- | --- |
| 112 | 0 | 90.6 | 9.4 | 86 | 85 | 160 | 165 |
| 114 | 0 | 58 | 42 | 82 | 81 | 170 | 170 |
| 116 | 0 | 31 | 69 | 70 | 72 | 175 | 175 |
| 118 | 0 | 10 | 90 | 66 | 65 | 170 | 178 |

It can thus be seen that the common mode impedance can be adjusted between about 66 to about 86 ohms over the range of window and door percentages shown. It is to be understood that one may select other percentages of window and door combinations while still remaining within the scope of the present invention.

Figure 16:
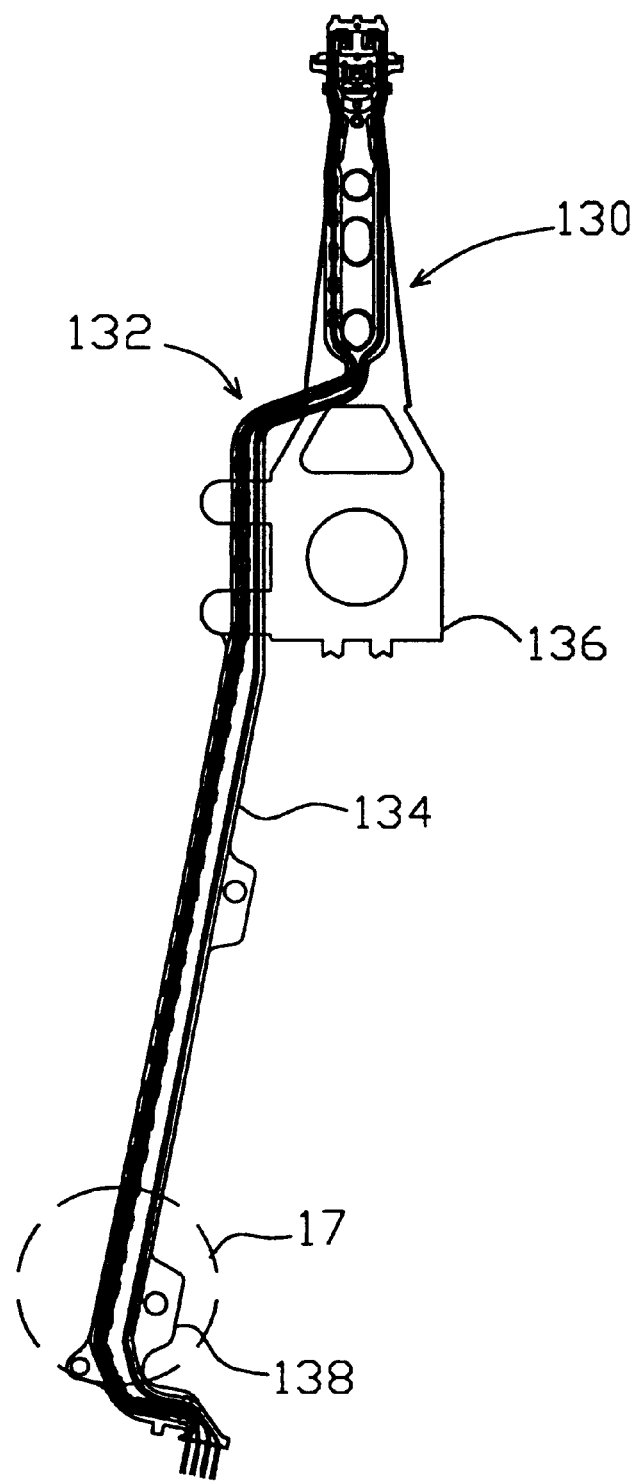
FIG. 16 is a plan view of a head suspension and trace assembly with the present invention located in a trace assembly of the suspension.
Figure 17:
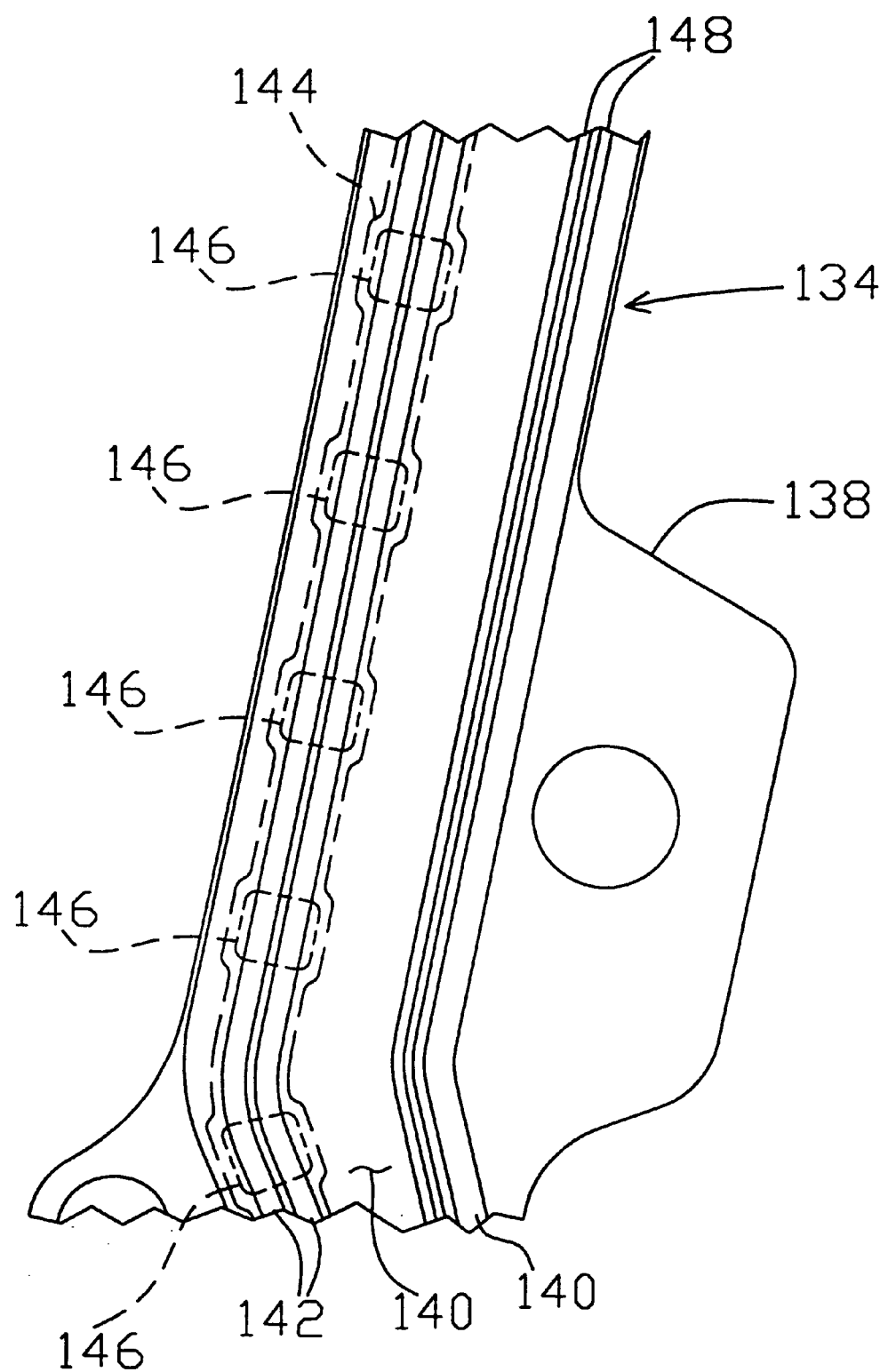
FIG. 17 is an enlarged detail view of region 17 of the trace assembly of FIG. 16.

Referring now to FIGS. 16 and 17, an alternative embodiment of the present invention may be seen. In this embodiment, a head suspension 130 has a flexure or trace assembly 132 with a "tail" 134 extending from a mounting region 136 of the head suspension 130. It is to be understood that the flexure or trace assembly 132 has a ground plane layer 138 (usually formed of stainless steel), an insulator layer 140 (usually formed of polyimide) and a layer made up of a plurality of conductive traces 142 (usually formed of copper or a copper alloy). The present invention may be embodied in such a trace assembly by forming a window 144 and islands 146 in the ground plane layer 138. It is to be understood that more than one window may be formed in the ground plane, even though in this embodiment there is only one opening or window 144 extending the length of the traces 142. In this embodiment, a seperate pair of traces 148 do not have the structure of the present invention associated therewith, but are shown as spaced from the ground plane 138 by the dieletric or insulator layer 140.

This invention is not to be taken as limited to all of the details thereof as modifications and variations thereof may be made without departing from the spirit or scope of the invention.

What is claimed is:

1. A method of adjusting the common mode impedance of printed circuit electrical traces on a head suspension assembly of the type having a load beam with a conductive layer separate from a layer containing the traces and forming a backed area for the traces and having at least one aperture in the conductive layer of the load beam, the aperture forming an unbacked area for the traces, the method comprising the steps of:

a) selecting and providing a ratio of the percentage area of unbacked to backed area for the traces to obtain a desired differential mode impedance for the traces; and b) providing a conductive island in the conductive layer in the at least one aperture with the island electrically isolated from the conductive layer of the load beam to adjust the ratio of the backed area formed by the conductive layer of the load beam and the backed area formed by the island.

2. The method of claim 1 wherein the conductive layer includes a plurality of apertures making up the unbacked area and step b) further comprises reducing the unbacked area by providing a plurality of islands in the conductive layer in at least some of the apertures, with at least some of the islands electrically isolated from a surrounding portion of the backed area.

3. The method of claim 1 wherein the conductive layer includes a plurality of apertures making up the unbacked area and step b) further comprises reducing the unbacked area by providing a plurality of islands in the conductive layer in at least some of the apertures, with at least some of the islands electrically isolated from a surrounding portion of the backed area in the conductive layer while holding the ratio of unbacked to backed area constant.

4. A method of designing the common mode impedance of printed circuit electrical traces mounted via an insulating layer to a conductive layer forming a backed area for the traces and having at least one aperture in the conductive layer, the aperture forming an unbacked area for the traces, the method comprising the steps of:

a) forming at least one fully backed test coupon with a continuously conductive layer under the traces;

b) forming at least one fully unbacked test coupon with an insulating layer free of any conductive layer under the traces;

c) forming at least one windowed test coupon with at least one aperture in the conductive layer under the traces;

d) forming at least one island test coupon with at least one electrically isolated island in at least one aperture in the conductive layer under the traces;

e) determining electrical transmission parameters for respective blocks representing each of the test coupons;

f) modeling a transmission line formed of a series of at least some of the blocks from step e);

g) repeating step f) with different combinations of blocks to get a desired common mode impedance while maintaining a desired differential mode impedance by:

i) controlling the differential mode impedance by adjusting the ratio of the percentage area of unbacked to the total backed area for the traces to maintain the desired differential mode impedance for the traces, and ii) controlling the common mode impedance by adjusting the ratio of the backed area formed by the conductive layer to the backed area formed by the island while keeping the total backed area relatively constant.

5. A method of controlling the differential and common mode impedances of a pair of traces forming a transmission line separated by an insulating layer from a ground plane layer, where the ground plane layer includes an electrically connected conductive region and at least one electrically isolated conductive island surrounded by the electrically connected conductive region comprising the steps of:

i) adjusting the ratio of the percentage of unbacked area in the ground plane layer to the total backed area in the ground plane layer to obtain a desired differential mode impedance for the traces, and ii) adjusting the ratio of the percentage of the electrically connected conductive area to the electrically isolated island area while keeping the total backed area formed by the sum of the electrically connected conductive area and electrically isolated island area relatively constant to obtain a desired common mode impedance.

6. A method for adjusting the common mode impedance of printed circuit electrical traces on a head suspension assembly of the type having a conductive layer separate from a layer containing the traces, the method comprising forming a conductive island in at least one aperture with both the island and the aperture in the conductive layer and wherein the island is electrically isolated from the conductive layer of the trace assembly.

7. The method of claim 6 wherein the conductive layer includes a plurality of apertures and the method further comprises forming a plurality of islands in the conductive layer in at least some of the apertures.

8. A method of adjusting the common mode impedance of printed circuit electrical traces on a head suspension assembly of the type having a plurality of electrical traces in one layer with a separate conductive layer forming a backed area for the traces and having at least one aperture in the conductive layer, the aperture forming an unbacked area for the traces, the method comprising the steps of:

a) selecting and providing a ratio of the percentage area of unbacked to backed area for the traces to obtain a desired differential mode impedance for the traces; and b) providing a conductive island in the conductive layer in the at least one aperture with the island electrically isolated from the conductive layer to adjust the ratio of the backed area formed by a surrounding portion of the conductive layer separate from the island and the backed area formed by the island.

9. The method of claim 8 wherein the conductive layer includes a plurality of apertures making up the unbacked area and step b) further comprises reducing the unbacked area by providing a plurality of islands in at least some of the apertures, with at least some of the islands electrically isolated from the surrounding portion of the backed area in the conductive layer.

10. The method of claim 8 wherein the conductive layer includes a plurality of apertures making up the unbacked area and step b) further comprises reducing the unbacked area by providing a plurality of islands in at least some of the apertures, with at least some of the islands electrically isolated from the surrounding portion of the backed area in the conductive layer while holding the ratio of unbacked to backed area constant.

* * * * *